United States Patent [19]

Polan

[11] Patent Number: 4,652,346
[45] Date of Patent: Mar. 24, 1987

[54] APPARATUS AND PROCESS FOR THE CONTINUOUS PLATING OF WIDE DELICATE METAL FOIL

[75] Inventor: Ned W. Polan, Madison, Conn.

[73] Assignee: Olin Corporation, New Haven, Conn.

[21] Appl. No.: 687,687

[22] Filed: Dec. 31, 1984

[51] Int. Cl.[4] .................................... C25D 7/06
[52] U.S. Cl. .......................... 204/15; 204/28; 204/206
[58] Field of Search .............. 204/28, 206–211, 204/15

[56] References Cited

U.S. PATENT DOCUMENTS

| | | | |
|---|---|---|---|
| 1,952,762 | 3/1934 | Levy et al. | 204/28 |
| 2,461,556 | 2/1949 | Lorig | 204/28 |
| 3,567,595 | 4/1974 | Yates | 204/28 |
| 3,803,013 | 3/1971 | Yates | 204/206 |
| 3,855,083 | 12/1974 | Hoeckelman | 204/28 |
| 3,864,235 | 2/1975 | Bobrov et al. | 204/206 |
| 4,118,302 | 10/1978 | Govert | 204/206 |
| 4,119,515 | 10/1978 | Costakis | 204/211 |
| 4,132,609 | 1/1979 | Bush et al. | 204/28 |
| 4,163,704 | 8/1979 | Murata | 204/206 |
| 4,426,266 | 1/1984 | Ukena et al. | 204/206 |
| 4,432,854 | 2/1984 | Takahashi et al. | 204/206 |
| 4,468,293 | 8/1984 | Polan et al. | 204/27 |
| 4,469,565 | 9/1984 | Hampel | 204/15 |
| 4,526,668 | 7/1985 | Podrini | 204/206 |

Primary Examiner—John F. Niebling
Assistant Examiner—William T. Leader
Attorney, Agent, or Firm—Barry L. Kelmachter; Howard M. Cohn; Paul Weinstein

[57] ABSTRACT

The present invention relates to a process and apparatus for forming a substantially uniform electrodeposit on a metal or metal alloy foil. The apparatus includes a frame assembly for substantially preventing bowing and/or flapping of the metal or metal alloy foil and for promoting substantially uniform electrodeposits by maintaining the gap between the foil and each treatment anode substantially constant. The process and apparatus have particular utility in the treatment of delicate copper foil for use in electronic and electrical applications.

21 Claims, 9 Drawing Figures

APPARATUS AND PROCESS FOR THE CONTINUOUS PLATING OF WIDE DELICATE METAL FOIL

The present invention relates to an apparatus and process for treating metallic materials such as metal or metal alloy sheets, strips and foils.

Various systems for electroplating and/or treating metal or metal alloy sheet, strip or foil are known in the art. Generally, the metallic material to be plated and/or treated is passed through a plating tank in parallel relationship to one or more anodes immersed in an electroplating electrolyte. In some of these systems, the material to be plated and/or treated is rendered cathodic by electrically connecting it to the negative terminal of a power source. In others, at least one cathode is immersed in the electrolyte. U.S. Pat. Nos. 2,461,556 to Lorig, 3,864,235 to Bobrov et al., 4,118,302 to Gobert, 4,119,515 to Costakis, 4,132,609 to Bush et al. and 4,469,565 to Hampel illustrate some of the electroplating systems known in the art.

One problem which has plagued electroplaters for a long time is the inability to produce a substantially uniform deposit across the entire surface of the article or material being plated. This problem is of particular concern in the treatment of wide, thin, delicate metallic foils to be used in printed circuit applications. There tend to be four primary reasons why uneven plating occurs. They are: (1) electrical edge effects; (2) poor material tracking through the electrolyte; (3) uneven interelectrode gaps; and (4) mechanical damage to the article or material being plated.

The edge effect problem is caused by the tendency of current density lines to be attracted to a sharp point or a series of points. As a result of this tendency, non-uniform electric fields are created at the edges of the article or material being plated. These non-uniform electric fields lead to uneven plating at the edges. The poor tracking problem generally takes the form of the article or material being plated wandering from the center of the pass line. This typically causes a heavier coating than desired on one edge of the article or material, while the other edge receives little or no coating. In those systems where the article or material being plated is rendered cathodic, uneven interelectrode gaps are caused by flapping and/or bowing of large unsupported areas of the article or material. Since the amount of plating in a particular zone is directly related to the gap between electrodes, uneven interelectrode gaps lead to uneven deposits. The mechanical damage problem is typically caused by the attempts to correct the other three problems.

It is known in the art that most of these difficulties can be overcome by holding the article or material to be plated in contact with the surface of a large diameter rotating drum and in close proximity to an anode concentric with the drum. While this solution effectively deals with the aforementioned problems, it has its own deficiencies. First, the process tends to be cumbersome. Second, in the context of forming a dendritic electrodeposit, it entails geometric conditions which restrict the ability to produce a superior quality uniform electrodeposit. Finally, the process precludes simultaneous electrodeposition on opposed surfaces of the article or material.

In various attempts to promote uniform plating, tapered anode designs, anodes of different widths, and/or barrier arrangements have been tried. A tapered anode approach for reducing uneven plating is illustrated in U.S. Pat. No. 3,855,083 to Hoeckelman. In this approach, each anode has a portion of its sides tapered in an attempt to prevent heavy edge deposits.

The second approach, anodes of different widths, is illustrated in U.S. Pat. No. 1,952,762 to Levy et al. In this approach, the article or material being plated passes between a series of anodes immersed in an electrolyte solution. Generally, the article or material passes through the plating tank containing the anodes in a serpentine manner. To subject all portions of the article or material to an average current density, some of the anodes are slightly greater in width than the article or material, while other anodes are slightly narrower in width than the article or material. To control movement of and support the article or material during plating, the article or material is passed along a guiding element. The guiding element comprises a frame having longitudinal and transverse members and edge contacts. In addition to its guiding and support functions, the guiding element is used to render the article or material cathodic and/or to limit plating to only one surface. To render the article or material cathodic, the frame is formed from electrically conductive materials, is itself connected to the negative terminal of a power source, and is at least partially covered with an electrically conductive material. One of the deficiencies of this approach is that there is no provision of a mechanism for substantially preventing flapping or bowing of the article or material being plated as it passes between each anode and its associated guide element.

The anode barrier approach is illustrated in U.S. Pat. Nos. 3,567,595 and 3,803,013, both to Yates. In this approach, the article to be plated is again passed through a series of anodes immersed in an electrolyte solution. An electrical insulating shield for preventing plating on one surface of the article is placed in parallel relationship with each anode. Each anode and its respective insulating shield define a channel through which the article passes and the electrolyte flows. To further structurally define the channel, a closed S-shaped barrier constructed of an electrically non-conductive material is connected between each anode side edge and the insulating shield. This S-shaped barrier serves to limit the lateral movement of the article. Here again, there is no provision for substantially preventing bowing or flapping of the material being plated. In addition, the use of the insulating shield precludes plating on more than one surface of the article.

In accordance with the present invention, an apparatus and a process for treating metallic materials such as metal or metal alloy foil, sheet and strip are described. The apparatus and process of the present invention have particular utility in the treatment of wide, thin delicate metal or metal alloy foils to be used in printed circuit applications.

Using the process and apparatus of the present invention, it has been found that substantially uniform deposits may be formed across the material being treated. In addition, the apparatus and process of the present invention allow either single or double sided treatment of the material with minimal edge effect and minimal irregularities on the central portions of the material. Still further, the apparatus of the present invention may be easily removed to facilitate servicing and/or to change from single sided to double sided treatment and vice-versa.

The apparatus of the present invention includes a tank containing an electrolyte solution and at least one anode at least partially immersed in the electrolyte solution. It also includes at least one frame assembly through which the material passes during treatment. In a preferred embodiment, the material to be treated is rendered cathodic by electrically connecting it to the negative terminal of an appropriate power source.

The frame assembly of the present invention performs a variety of services. First, it serves to hold the material being treated substantially parallel to and at a substantially constant distance from each treatment anode. As a result, the interelectrode gap is maintained substantially constant. Second, for heavier metallic materials, it may be used to limit the lateral movement of the material and thereby substantially eliminate poor tracking of the material through the treatment zone. The frame further assists in substantially preventing mechanical damage to the material.

The frame assembly comprises at least one plating window formed by a plurality of longitudinal members and a plurality of transverse members. The plating window or windows substantially prevent any flapping and/or bowing of the material being treated. Since, the material being treated is preferably rendered cathodic, this means that a substantially constant interelectrode gap can be maintained and uniform plating can be promoted. Where only one sided treatment is desired, the frame assembly further includes a solid backing plate for limiting treatment to only one side of the material. Where two-sided treatment is desired, the frame assembly has a plurality of plating windows. For treating relatively wide materials, each plating window may also have one or more angled members to assist in keeping the material substantially parallel to the anode(s).

The process and apparatus of the present invention may be used to treat a wide variety of materials. For example, they may be used to plate copper onto copper, chromium onto copper, copper onto steel, or the like. In addition, the process and apparatus of the present invention can be used to form a substantially uniform smooth electrodeposit or a substantially uniform dendritic electrodeposit on one or more surfaces of the material being treated.

Accordingly, it is an object of the present invention to provide an apparatus and a process for promoting the formation of substantially uniform electrodeposits on metal or metal alloy materials.

It is a further object of the present invention to provide a process and apparatus as above for treating one or more surfaces of the material.

It is a further object of the present invention to provide a process and apparatus as above for treating copper foil to be used in printed circuit applications.

These and further objects and advantages will become apparent from the following description and drawings in which like reference numerals depict like elements.

In accordance with the present invention, an apparatus and process for promoting the formation of substantially uniform electrodeposits across at least one surface of a metal or metal alloy material are described. As previously mentioned, the apparatus and process of the present invention are applicable to the treatment of a wide variety of metal or metal alloy materials. For example, the apparatus and process may be used in the treatment of metal or metal alloy strip, sheet or foil. In addition, they may be used in the treatment of a wide variety of metallic materials including but not limited to copper, copper alloys, nickel, nickel alloys, steel and steel alloys. The ensuing description of the treatment of copper alloy foil should not be restrictive of the broad scope of the present invention.

Figure 1:
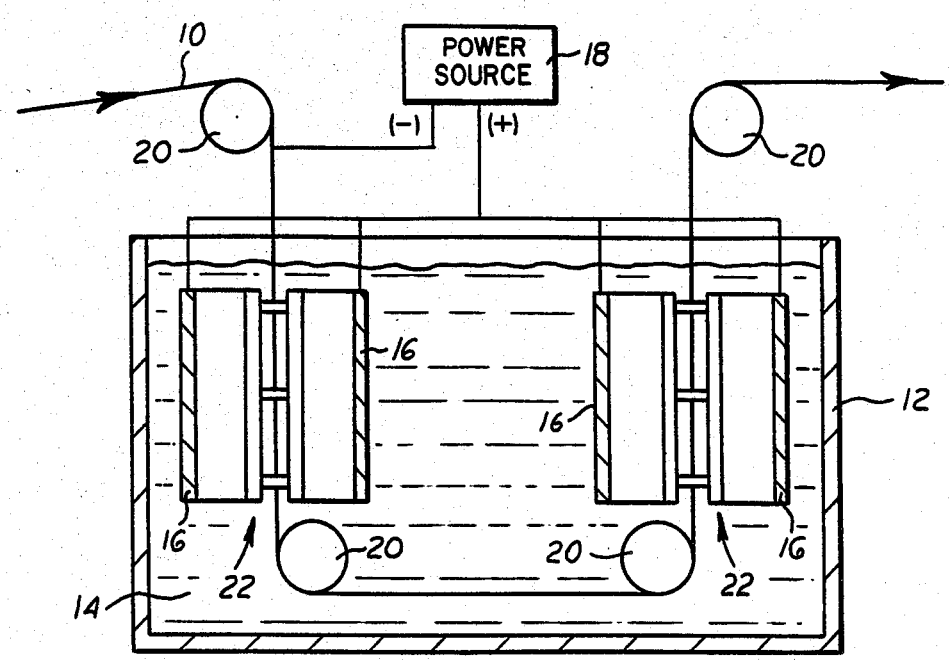
FIG. 1 is a cross sectional view of a treatment apparatus in accordance with the present invention.
Figure 2:
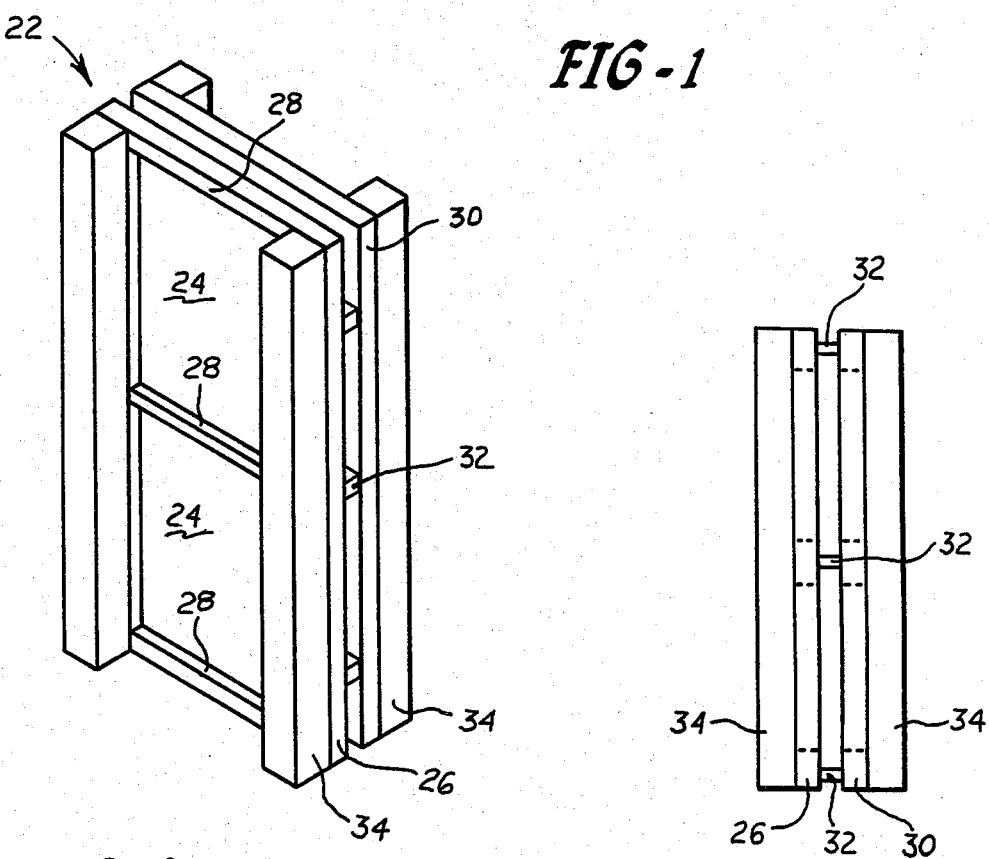
FIG. 2 is a plan view of the frame assembly used to control the movement of the metal or metal alloy foil through the treatment apparatus of FIG. 1.
Figure 3:
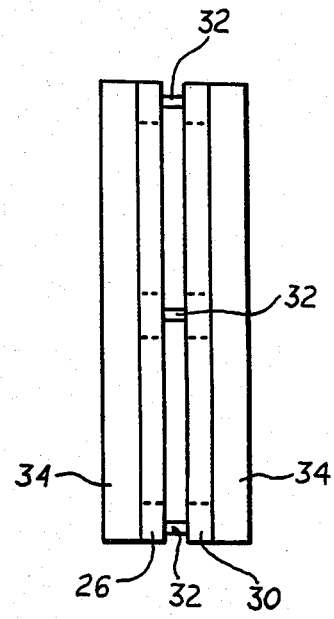
FIG. 3 is a side view of the frame of FIG. 2.
Figure 4:
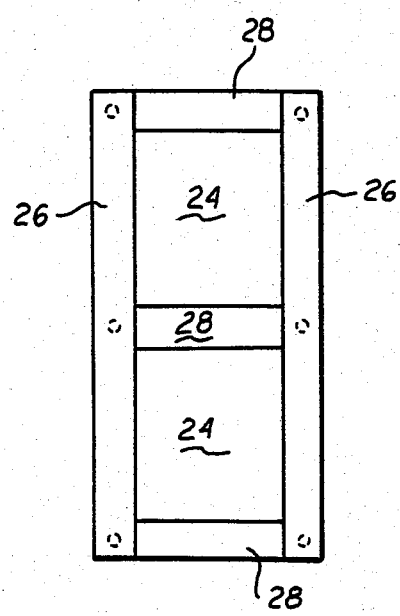
FIG. 4 is a front view of a first embodiment of the frame of FIG. 2.

Referring now to FIG. 1 of the drawings, a treatment apparatus in accordance with the present invention is illustrated. The treatment apparatus may be used to form either a smooth electrodeposit or a dendritic electrodeposit on at least one surface of the foil 10. The treatment apparatus comprises a tank 12 containing an electrolyte solution 14. The electrolyte solution may comprise any suitable solution containing a desired concentration of metal or metals to be electrodeposited onto the foil 10. For forming a copper electrodeposit on the foil 10, a sulfuric acid-copper sulfate solution may be used as the electrolyte. The tank 12 may be formed from any suitable material such as lead or polyethylene and may be provided with appropriate means not shown for adding and withdrawing the electrolyte solution 14.

The treatment apparatus further comprises a plurality of anodes or anode plates 16. The anodes or anode plates 16 may be totally or partially immersed in the electrolyte 14 and may be formed from any suitable electrically conductive material. For example, they may be formed from either consumable materials such as copper or formed from or surfaced with non-consumable metals and metal oxides including platinum, lead and lead alloys such as a Pb-6% Sb alloy. The anode or anode plates may be electrically connected to the positive terminal of a power source 18 in any suitable manner known in the art. The power source 18 may comprise any suitable DC or AC power supply known in the art. The anode or anode plates 16 are preferably mounted in the tank 12 in substantially vertical planes. Any suitable means (not shown) known in the art such as a support frame on top of the tank 12 may be used to mount the anode or anode plates 16 in the tank 12.

The continuous copper alloy foil 10 to be treated is fed from a supply reel not shown. Prior to being treated, the foil 10 may be cleaned and/or degreased using any suitable cleaning and/or degreasing technique known in the art. If desired, the foil 10 may also be pre-treated to have a fresh layer of metal formed on the surface or surfaces to be treated. Techniques for cleaning and/or degreasing a copper foil and/or forming a fresh metal layer thereon are described in co-pending U.S. patent application Ser. Nos. 670,236 to Parthasarathi et al. for Electrochemical Surface Preparation for Improving the Adhesion Properties of Metallic Surface, now U.S. Pat. No. 4,549,941, 670,239 to Parthasarathi for a Preparation For Improving the Adhesion Properties of Metal Foils, now U.S. Pat. No. 4,552,627 and 670,232 to Polan et al. for Systems For Producing Electroplated and/or Treated Metal Foil, now U.S. Pat. No. 4,549,950 all filed on Nov. 13, 1984, which are hereby incorporated by reference herein.

The foil 10 is preferably passed through the tank 12 in a serpentine manner through the use of a plurality of rollers 20. The rollers may be formed from either electrically non-conductive materials or metallic materials coated with an electrical insulating material. Additionally, the rollers 20 may be mounted in the tank 12 in any suitable manner. For example, the rollers may be mounted in the tank by a frame not shown mounted to the top of the tank.

In performing the process of the present invention, the foil 10 is preferably rendered cathodic. To do this, the foil 10 may be electrically connected to the negative terminal of the power source 18 in any suitable manner. For example, the foil 10 may be rendered cathodic by forming one of the rollers 20 with which the foil 10 comes into contact from an electrically conductive material and connecting the roller to the negative terminal of the power source 18.

The apparatus thus far described is similar to other electroplating apparatuses. However, unlike the other apparatusses, the apparatus of the present invention includes a frame assembly 22 for controlling the movement of the foil 10 through the treatment tank. The frame assembly 22 controls foil movement so that at substantially all times, the foil 10 is maintained at a desired distance from each treatment anode. In addition, the frame assembly substantially prevents any flapping and/or bowing of the foil and may be used, if necessary, to limit the transverse movement of the foil 10. By controlling movement of the foil in this manner, it is possible to form substantially uniform electrodeposits across the surface or surfaces of the foil to be treated.

Figure 6:
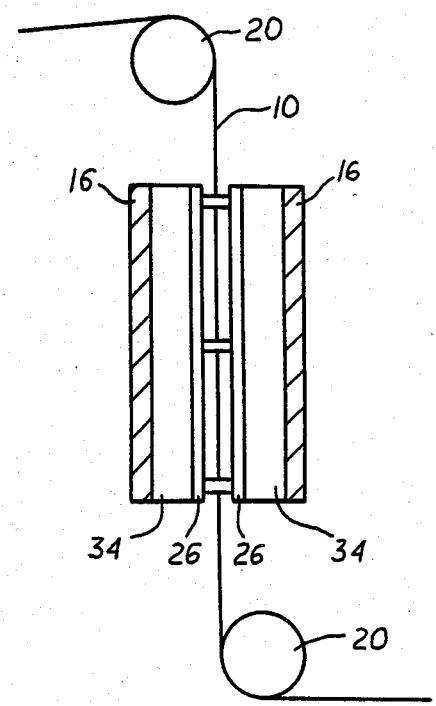
FIG. 6 is a cross sectional view of an alternative frame and anode construction for two sided treatment of a metal or metal alloy foil.
Figure 5:
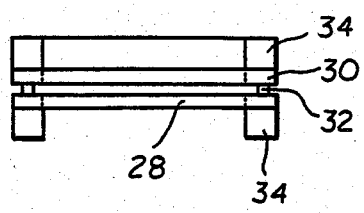
FIG. 5 is a top view of the frame of FIG. 2.

Referring now to FIGS. 2-6, the frame assembly 22 comprises at least one plating window 24 formed by a plurality of longitudinal members 26 and a plurality of transverse members 28. Each plating window 24 serves to substantially prevent the undesirable bowing and/or flapping of the foil 10. If the foil were permitted to bow and/or flap, thicker deposits would be formed on those portions closest to a treatment anode. This could be particularly troublesome if it is the edge portions of the foil that are bowing and/or flapping. In such a situation, it is possible that the current density at the edges could become sufficiently high that dendritic plating occurs at the edges while, at the same time, smooth plating is occuring at the central portions of the foil. Where two-sided treatment of the foil is desired, the frame assembly 22 may have a plating window 24 adjacent each surface of the foil to be treated. Such a frame assembly is illustrated in FIG. 6. Where it is desired to treat only one surface of the foil 10, the frame assembly 22 preferably includes a solid backing plate 30. The purpose of this backing plate is to substantially prevent plating on the surface of the foil facing away from the anode 16.

The frame assembly 22 further includes a plurality of spacers 32 connecting either the longitudinal members 32 of each plating window with a solid backing plate or the longitudinal members of a plurality of plating windows. The spacers 32 along with the longitudinal and transverse members 26 and 28 and/or the backing plate 30 define a protective, open-sided passageway through which the foil 10 travels as it is being treated. This protective passageway serves to significantly reduce the potential for mechanical damage to the foil while permitting a desired electrolyte flow about the foil. During the treatment of thick foils, such as strip and sheet material, the spacers 32 may also function as stops for limiting any wandering of the foil 10 from the center line of the pass. If desired, the spacers 32 may be used to substantially prevent transverse movement of such materials.

The frame assembly 22 further includes a plurality of edge shields 34. The edge shields 34 help to substantially eliminate edge effect problems by directing the field lines in the vicinity of the foil edges. By doing this, the potential for forming heavy edge deposits is diminished. The edge shields 34 may be solid or perforated members.

To further reduce the potential for edge effect problems, each plating window and each anode has a width substantially equal to or slightly less than the width of the foil. Preferably, the width of each plating window is equal to the foil width, while the width of each anode is slightly less than the foil width. By providing such a frame and anode assembly, the current density lines generated in the vicinity of the foil edges should not go around the edges and create heavy edge deposits. Preferably, the width of each anode is less than the width of the foil by an amount equal to about 0.4 to about 0.5 times the interelectrode gap.

The entire frame assembly 22 is preferably formed from an electrically non-conductive material which is chemically resistant to attack from the electrolyte 14. Any suitable non-conductive material such as polyvinylchloride may be used. In addition, all frame edges which contact or may contact the foil 10 are preferably beveled and smoothed so as to avoid foil damage. The frame assembly or assemblies 22 may be mounted in the tank 12 in any suitable mannner. For example, the backing plate 30 of the frame assembly may be used to mount the frame assembly to an anode 16. Alternatively, the frame assembly may be mounted to a suitable support structure not shown such as the frame used to hold the rollers in the tank.

Figure 7:
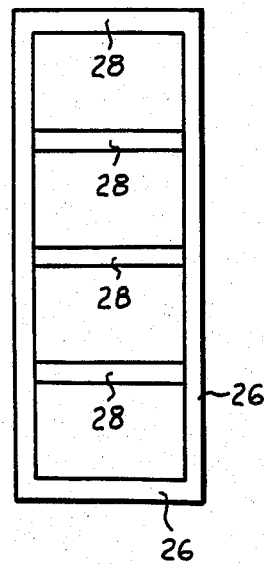
FIG. 7 is a front view of an alternative frame construction.
Figure 8:
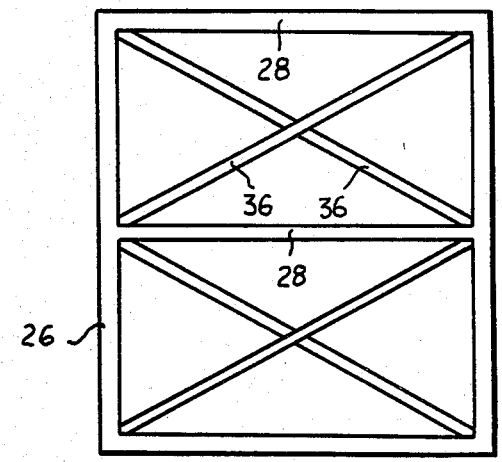
FIG. 8 is a front view of yet another alternative frame construction.

For treating relatively wide foils, each plating window may have multiple transverse members 28 such as those shown in FIG. 7 spaced relatively close together or angled tracking bars 32 such as those shown in FIG. 8. The use of the multiple transverse members of FIG. 7 or the angled tracking bars of FIG. 8 help to maintain the foil parallel to the anode(s).

In operation, a frame assembly 22 is placed between adjacent ones of the anodes 16. The foil 10 is threaded through the tank 12 in a serpentine manner by passing the foil 10 through the passageway defined by each frame assembly 22 and over the rollers 20. If only one sided treatment is to be effected using a single anode 16 and a single frame assembly 22 or if two sided treatment is to be effected using a pair of anodes and a single frame assembly 22, the foil 10 may be alternatively passed through the tank 12 in a substantially linear fashion. To effect the desired plating or treatment, a desired current having a desired current density is applied to the anode(s) 16 and the foil 10. Preferably, the plating or treatment takes place while the foil is moving in a vertical direction.

As previously mentioned, the treatment applied to the foil may comprise either the formation of a smooth electrodeposit on one or more foil surfaces or the formation of a dendritic electrodeposit on one or more foil surfaces. The type of electrodeposit that will be formed is a function of the applied current density and the limiting current density of the electrolyte. Smooth electrodeposits are formed when the applied current density is below the limiting current density and dendritic electrodeposits are formed when the applied current density exceeds the limiting current density. One technique for forming well bonded dendritic electrodeposits that may be used is that shown in U.S. Pat. No. 4,468,293 to Polan et al. In this technique, a current having regularly recurring pulses is used to form and bond the dendrites to the foil surface(s). The dendrites are formed during a first portion of each pulse having a current density exceeding the limiting current density of the electrolyte and are bonded to the foil during a second portion of each pulse having a current density below the limiting current density.

After the foil 10 has been treated and exits the tank 12, it may be rinsed, dried and/or further treated. For example, an anti-tarnishing treatment may be applied to the treated foil. This anti-tarnishing treatment may comprise any suitable anti-tarnishing treatment known in the art such as immersion in a chromic acid solution. If the foil 10 is to be rinsed and/or dried, any suitable rinse system known in the art (not shown) such as a water rinse system and/or any suitable drying system known in the art (not shown) such as a hot air drying tunnel may be used. After any of these additional treatments, the foil 10 may be coiled on a take-up reel not shown.

When treating copper foil so as to form a copper electrodeposit on the foil, the electrolyte preferably comprises a copper sulfate-sulfuric acid solution. For a copper sulfate-sulfuric acid solution to be used at room temperature, the solution should contain a copper concentration in the range of about 5 g/l to about 60 g/l, preferably from about 10 g/l to about 40 g/l, and a sulfuric acid concentration in the range of about 10 g/l to about 100 g/l. To form a smooth electrodeposit, the applied current may have a current density in the range of about 5 mA/cm$^2$ to about 25 mA/cm$^2$ and may be applied for a deposition time in the range of about 5 sec. to about 120 sec. For dendritic electrodeposits, the applied current may have a current density in the range of about 55 mA/cm$^2$ to about 350 mA/cm$^2$ and a deposition time in the range of about 2 sec. to about 120 sec. It should be recognized that the foregoing concentrations, current densities and deposition times are dependent upon the temperature of the electrolyte solution. For solutions at elevated temperatures, these variables may have to be adjusted. To keep the electrolyte 14 at a desired temperature, the tank 12 may be provided with a suitable heating/cooling loop not shown. The heating/cooling loop may comprise any suitable heating and/or cooling system known in the art.

It should be apparent from the foregoing discussion that the frame assembly of the present invention provides many advantages over other attempts to generate substantially uniform electrodeposits. It successfully deals with such problems as edge effects, poor tracking and uneven interelectrode gaps while reducing the potential for mechanical damage of the foil. It does not require the use of specially constructed anodes i.e. slotted anodes, and provides effective electrolyte circulation about the material being treated. Finally, either one-sided or two-sided treatments can be applied using the present frame assembly. In this regard, the frame assembly lends itself to easy removal and installation for changing from one-sided treatment to two-sided treatment and vice-versa.

Figure 9:
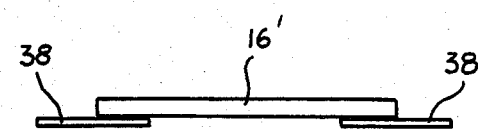
FIG. 9 illustrates an alternative anode construction to be used in the treatment apparatus of FIG. 1.

While the anode(s) have been illustrated as being essentially in plate form, it is also possible to provide the anodes with adjustable shutter portions 38 along their side edges. A top view of such an anode 16' is illustrated in FIG. 9. By using such an anode construction, it is possible to optimize the plating effect along the edges of the foil and further insure a substantially uniform plating across the foil surface. Any suitable means (not shown) known in the art may be used to move the shutter portions 38 relative to the main body of the anode 16'.

The U.S. Patents and patent applications set forth in this specification are intended to be incorporated by reference herein.

It is apparent that there has been provided in accordance with this invention an apparatus and process for the continuous plating of wide, delicate metal foil which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to cover all such alternatives, modifications and variations as fall within the spirit and broad scope of the appended claims.

What is claimed:

1. An apparatus for treating metal or metal alloy foil, said apparatus comprising:
   a tank;
   an electrolyte solution having a concentration of metal to be deposited onto said foil within said tank;
   a treatment anode at least partially immersed in said electrolyte solution;
   said foil passing through said electrolyte solution in spaced relationship with said anode;
   a frame assembly for controlling movement of said foil through said tank so as to maintain said foil at a substantially constant distance from said anode and for substantially preventing bowing and/or flapping of said foil, said frame assembly including a plurality of spaced-apart first members and a plurality of spaced-apart second members substantially transverse to said first members;
   said transverse members interconnecting said first members and defining with said first members at least one plating window; and
   said transverse members being intermediate said anode and a surface of said foil to be plated.

2. The apparatus of claim 1 wherein each said plating window has a width slightly less than the width of said foil.

3. The apparatus of claim 1 wherein each said plating window has a width substantially equal to the width of said foil.

4. The apparatus of claim 1 wherein said frame assembly further includes a solid backing plate for limiting plating to only one side of said foil, said foil passing between said backing plate and said at least one plating window.

5. The apparatus of claim 4 wherein said frame assembly further includes a plurality of spacers between said backing plate and said first members, said spacers allowing limited transverse movement of said foil.

6. The apparatus of claim 1 further comprising:
said first and transverse members defining a plurality of plating windows for treating opposed surfaces of said foil, at least one of said plating windows being provided on opposed sides of said foil; and
said foil passing between said plating windows.

7. The apparatus of claim 6 further comprising:
a plurality of spacers between said first members defining said plating windows; and
said spacers allowing limited transverse movement of said foil.

8. The apparatus of claim 1 wherein said frame assembly further includes a plurality of edge shields for minimizing the effect of the current density lines formed adjacent the lateral edges of said foil.

9. The apparatus of claim 1 wherein said frame assembly further includes at least one diagonal member for assisting in preventing said bowing and/or flapping of said foil.

10. The apparatus of claim 1 further comprising:
a plurality of anodes immersed in said electrolyte solution; and
said frame assembly being positioned between adjacent ones of said anodes.

11. The apparatus of claim 10 further comprising:
a plurality of frame assemblies in said tank;
each of said frame assemblies being positioned between adjacent ones of said anodes; and
said foil passing through said tank in a serpentine fashion.

12. The apparatus of claim 1 further comprising:
said members forming said frame assembly being formed from an electrically non-conductive material.

13. The apparatus of claim 1 wherein said treatment anode comprises an adjustable anode.

14. The apparatus of claim 1 wherein said foil passes through said frame assembly.

15. The apparatus of claim 1 further comprising:
said first and second members being substantially co-planar.

16. The apparatus of claim 1 further comprising:
said first and second members defining a plurality of plating windows.

17. A process for forming a substantially uniform plating on a surface of a metal or metal alloy foil, said process comprising:
providing a tank containing an electrolyte solution having a concentration of metal ions to be deposited onto said foil surface;
at least partially immersing an anode in said electrolyte solution;
passing said foil through said electrolyte solution in spaced relation with said anode;
maintaining said foil surface at a substantially constant distance from said anode and substantially preventing bowing and/or flapping of said foil;
said maintaining and preventing step comprising providing a frame assembly having a plurality of first members and a plurality of second members substantially transverse to said first members, said second members interconnecting said first members and defining with said first members at least one plating window intermediate said foil surface and said anode; and passing said foil through said frame assembly; and
applying a current having a desired current density to said foil and said anode to form said substantially uniform plating on said foil surface.

18. The process of claim 17 further comprising:
providing said tank with a plurality of anodes, each said anode being at least partially immersed in said electrolyte solution;
said maintaining step further comprising providing a plurality of frame assemblies and positioning each said frame assembly between adjacent one of said anodes; and
passing said foil through said tank in a serpentine fashion.

19. The process of claim 17 further comprising:
plating opposed surfaces of said foil.

20. The process of claim 17 further comprising:
plating a smooth layer of metal or metal alloy onto said foil surface.

21. The process of claim 17 further comprising:
plating a dendritic layer of metal or metal alloy onto said foil surface.

* * * * *

UNITED STATES PATENT AND TRADEMARK OFFICE
CERTIFICATE OF CORRECTION

PATENT NO. : 4,652,346

DATED : March 24, 1987

INVENTOR(S) : Ned W. Polan and Arvind Parthasarathi

It is certified that error appears in the above—identified patent and that said Letters Patent is hereby corrected as shown below:

Correct the Inventors to read Ned W. Polan, Madison, Conn. and Arvind Parthasarathi, Hamden, Conn.

Signed and Sealed this

Sixth Day of October, 1987

Attest:

DONALD J. QUIGG

*Attesting Officer*　　　　　　　*Commissioner of Patents and Trademarks*